(12) United States Patent
Rice et al.

(10) Patent No.: US 6,911,079 B2
(45) Date of Patent: Jun. 28, 2005

(54) METHOD FOR REDUCING THE RESISTIVITY OF P-TYPE II-VI AND III-V SEMICONDUCTORS

(75) Inventors: Peter Rice, South Easton, MA (US); Schang-Jing Hon, Taipei (TW); Alexander Wang, Taipei (TW); Kevin O'Connor, North Easton, MA (US)

(73) Assignee: Kopin Corporation, Taunton, MA (US)

( * ) Notice: Subject to any disclaimer, the term of this patent is extended or adjusted under 35 U.S.C. 154(b) by 357 days.

(21) Appl. No.: 10/127,345

(22) Filed: Apr. 19, 2002

(65) Prior Publication Data

US 2003/0199171 A1 Oct. 23, 2003

(51) Int. Cl.[7] ............................................. C30B 29/40
(52) U.S. Cl. ................... 117/2; 117/3; 117/953; 117/954; 117/955; 117/956
(58) Field of Search .................. 117/2, 3, 953, 117/954, 955, 956

(56) References Cited

U.S. PATENT DOCUMENTS

| | | | |
|---|---|---|---|
| 4,153,905 A | 5/1979 | Charmakadze et al. | |
| 4,495,514 A | 1/1985 | Lawrence et al. | |
| 4,625,182 A | * 11/1986 | Bovino et al. | 331/107 G |
| 4,670,088 A | 6/1987 | Tsaur et al. | |
| 4,946,548 A | 8/1990 | Kotaki et al. | |

(Continued)

FOREIGN PATENT DOCUMENTS

| | | |
|---|---|---|
| EP | 0 483 688 A2 | 5/1992 |
| EP | 0 483 688 B1 | 5/1992 |
| JP | 52/028887 | 3/1977 |
| JP | 54-093380 | 7/1979 |
| JP | 59-228776 | 12/1984 |
| JP | 61-256474 | 3/1986 |
| JP | 02-229475 | 9/1990 |
| JP | 2229475 | 9/1990 |
| JP | 03-203388 | 9/1991 |
| JP | 03-218625 | 9/1991 |
| JP | 03-252177 | 11/1991 |
| JP | 04-068579 | 3/1992 |
| JP | 4209577 | 7/1992 |
| JP | 4236478 | 8/1992 |
| JP | 04-242985 | 8/1992 |
| JP | 05-243614 | 9/1993 |
| JP | 06-021511 | 1/1994 |
| JP | 06-177423 | 6/1994 |
| JP | 06-268259 | 9/1994 |
| JP | 8167735 | 6/1996 |
| JP | 8213692 | 8/1996 |
| JP | 8306643 | 11/1996 |
| JP | 8306958 | 11/1996 |
| JP | 8316527 | 11/1996 |
| JP | 9092880 | 4/1997 |
| JP | 9134881 | 5/1997 |
| JP | 9167857 | 6/1997 |
| JP | 11145513 | 5/1999 |
| WO | WO 88/00392 | * 1/1988 |

OTHER PUBLICATIONS

Foresi, J.S. and Moustakas, T.D., "Metal contacts to gallium nitride," *Appl. Phys. Lett.* 62(22):2859–2861 (1993).

Nakamura, S., "InGaN blue—light—emitting diodes," *Journal of the Institute of Electronics, Information and Communication Engineers* 76(9):913–917 (1993) (Abstract).

(Continued)

*Primary Examiner*—Robert Kunemund
(74) *Attorney, Agent, or Firm*—Hamilton, Brook, Smith & Reynolds, P.C.

(57) ABSTRACT

The resistivity of a p-doped III-V or a p-doped II-VI semiconductor material is reduced. The reduction of resistivity of the p-type III-V or a II-VI semiconductor material is achieved by applying an electric field to the semiconductor material. III-V nitride-based light emitting diodes are prepared.

19 Claims, 8 Drawing Sheets

U.S. PATENT DOCUMENTS

| | | | |
|---|---|---|---|
| 4,966,862 A | | 10/1990 | Edmond |
| 5,091,333 A | | 2/1992 | Fan et al. |
| 5,210,051 A | | 5/1993 | Carter, Jr. |
| 5,239,188 A | | 8/1993 | Takeuchi et al. |
| 5,247,533 A | | 9/1993 | Okazaki et al. |
| 5,272,108 A | | 12/1993 | Kozawa |
| 5,278,433 A | | 1/1994 | Manabe et al. |
| 5,281,830 A | | 1/1994 | Kotaki et al. |
| 5,285,078 A | | 2/1994 | Mimura et al. |
| 5,290,393 A | | 3/1994 | Nakamura |
| 5,306,662 A | | 4/1994 | Nakamura et al. |
| 5,323,022 A | | 6/1994 | Glass et al. |
| 5,334,277 A | | 8/1994 | Nakamura |
| 5,369,289 A | | 11/1994 | Tamaki et al. |
| 5,385,862 A | | 1/1995 | Moustakas |
| 5,406,123 A | | 4/1995 | Narayan |
| 5,408,120 A | | 4/1995 | Manabe et al. |
| 5,433,169 A | | 7/1995 | Nakamura |
| 5,468,678 A | | 11/1995 | Nakamura et al. |
| 5,563,422 A | | 10/1996 | Nakamura et al. |
| 5,578,839 A | | 11/1996 | Nakamura et al. |
| 5,652,434 A | | 7/1997 | Nakamura et al. |
| 5,686,738 A | | 11/1997 | Moustakas |
| 5,733,796 A | | 3/1998 | Manabe et al. |
| 5,734,182 A | | 3/1998 | Nakamura et al. |
| 5,747,832 A | | 5/1998 | Nakamura et al. |
| 5,751,752 A | | 5/1998 | Shakuda |
| 5,767,581 A | | 6/1998 | Nakamura et al. |
| 5,777,350 A | | 7/1998 | Nakamura et al. |
| 5,828,684 A | | 10/1998 | Van de Walle |
| 5,850,410 A | | 12/1998 | Kuramata |
| 5,877,558 A | | 3/1999 | Nakamura et al. |
| 5,880,486 A | | 3/1999 | Nakamura et al. |
| 5,905,276 A | | 5/1999 | Manabe et al. |
| 5,959,307 A | | 9/1999 | Nakamura et al. |
| 5,998,925 A | | 12/1999 | Shimizu et al. |
| 6,017,774 A | | 1/2000 | Yuasa et al. |
| 6,051,849 A | | 4/2000 | Davis et al. |
| 6,066,861 A | | 5/2000 | Höhn et al. |
| 6,067,222 A | * | 5/2000 | Hausmann ............... 361/234 |
| 6,069,440 A | | 5/2000 | Shimizu et al. |
| 6,078,063 A | | 6/2000 | Nakamura et al. |
| 6,084,899 A | | 7/2000 | Shakuda |
| 6,093,965 A | | 7/2000 | Nakamura et al. |
| 6,115,399 A | | 9/2000 | Shakuda |
| 6,153,010 A | | 11/2000 | Kiyoku et al. |
| 6,172,382 B1 | | 1/2001 | Nagahama et al. |
| 6,204,512 B1 | | 3/2001 | Nakamura et al. |
| 6,215,133 B1 | | 4/2001 | Nakamura et al. |
| 6,241,344 B1 | * | 6/2001 | Machida ................ 347/66 |
| 6,245,259 B1 | | 6/2001 | Höhn et al. |
| 6,249,012 B1 | | 6/2001 | Manabe et al. |
| 6,337,493 B1 | | 1/2002 | Tanizawa et al. |
| 6,362,017 B1 | | 3/2002 | Manabe et al. |
| 2001/0022367 A1 | | 9/2001 | Nakamura et al. |
| 2001/0030318 A1 | | 10/2001 | Nakamura et al. |
| 2001/0050375 A1 | * | 12/2001 | Von Dalen ............... 257/141 |
| 2002/0046693 A1 | | 4/2002 | Kiyoku et al. |
| 2002/0060326 A1 | | 5/2002 | Manabe et al. |

OTHER PUBLICATIONS

Akasaki, I. and Amano, H., "High efficiency UV and blue emitting devices preared by MOVPE and low energy electron beam irradiation treatment," *Physical Concepts of Materials for Novel Optoelectronic Device Applications, 1361*:138–149 (1990).

Amano, H., et al., "P–Type Conduction in Mg–Doped GaN Treated with Low–Energy Electron Beam Irradiation (LEEBI)", *Japanese Journal of Applied Physics* 28(12):L2112–L2114 (1989).

Andreev, V.M., et al., "Luminescence Properties of i–n, i–n–i and n–i–n Structures Made of Epitaxial Layers GaN/$\alpha$–$Al_2O_3$," *Journal of Luminescence* 35:9–16 (1986).

Boulou, M., et al., "Recombination Mechanisms in GaN:Zn," *Journal of Luminescence* 18/19:767–770 (1979).

Casey, Jr., H.C. and Panish, M.B., "SLAB–Dielectric Waveguides," in *Heterostructure Lasers*, (NY: Academic Press), pp. 32–35 (1978).

Goldenberg, B., et al., "Ultraviolet and violet light–emitting GaN diodes grown by low–pressure metalorganic chemical vapor deposition," *Appl. Phys. Lett.* 62(4):381–383 (1993).

F. Goodenough, "Exotic Semiconductors Showcased at the IEDM," *Electronic Design*, pp. 60, 62, 64–66, 68 (1994).

Hayashi, I., et al., "Junction Lasers Which Operate Continuously at Room Temperature," *Appl. Phys. Lett.* 17(3):109–111 (1970).

Jacob, G., et al., "GaN Electroluminescent Devices: Preparation and Studies," *Journal of Luminescence* 17:263–282 (1978).

Jang, J.–S., et al., "High Quality Non–Alloyed Pt Ohmic Contacts to P–Type GaN Using Two–Step Surface Treatment," *MRS Internet J. Nitride Semiconductor Res. F99W10.4*.

Kaminska, E., et al., "Ni/Si–Based Contacts to GaN: Thermally Activated Structural Transformations Leading to Ohmic Behavior," *MRS Internet J. Nitride Semicond. Res. 4S1, G9.9*.

Kampen, T.U. and Mönch, W., "Metal Contacts on a–GaN," *MRS Internet J. Nitride Semicond. Res. 1*(41).

Madar, R., "High Pressure Solution Growth of $GaN^-$," *Journal of Crystal Growth* 31:197–203 (1975).

Matsuoka, T., "Growth and Properties of a Wide–Gap Semiconductor InGaN," *Optoelectronics* 5(1):53–64 (1990).

T. Matsuoka, "Current status of GaN and related compounds as wide–gap semiconductors," *Journal of Crystal Growth* 124:433–438 (1992).

Nakamura, S., et al., "High–power InGaN/GaN double–heterostructure violet light emitting diodes," *Appl. Phys. Lett.* 62(19):2390–2392 (1993).

Nakamura, S., et al., "P–GaN/N–InGaN/N–GaN Double–Heterostructure Blue–Light–Emitting Diodes," *Jpn. J. Appl. Phys.* 32:L8–L11 (1993).

S. Nakamura, "Growth of $In_xGa_{1-x}N$ compound semiconductors and high–power InGaN/AlGaN double heterostructure violet–light–emitting diodes," *Microelectronics Journal* 25:651–659 (1994).

Nakamura, S., et al., "High–Power GaN P–N Junction Blue–Light–Emitting Diodes," *Japanese Journal of Applied Physics* 30(12A):L1998–L2001 (1991).

S. Nakamura, "InGaN/AlGaN Double–Heterostructure Blue LEDs," *Mat. Res. Soc. Symp. Proc. vol.* 339:173–178 (1994).

Nakamura, S., et al., "Thermal Annealing Effects on P–Type Mg–Doped GaN Films," *Jpn. J. Appl. Phys.* 31:L139–L142 (1992).

S. Nakamura, "Zn–doped InGaN growth and InGaN/AlGaN double–heterostructure blue–light–emitting diodes," *Journal of Crystal Growth* 145:911–917 (1994).

Nakamura, S., et al., "High–brightness InGaN/AlGaN double–heterostructure blue–green–light–emitting diodes," *J. Appl. Phys.* 76(12):8189–8191 (1994).

Nakamura, S., et al., "Cd–Doped InGaN Films Grown on GaN Films," *Jpn. J. Appl. Phys.* 32:L338–L341 (1993).

S. Nakamura, "High–Power InGaN/AlGaN Double–Heterostructure Blue–Light–Emitting Diodes," Int'l Electronic Devices Meeting 94:567–570 (1994).

Piotrowska, A., et al., "Ohmic Contacts to III–V Compound Semiconductors: A Review of Fabrication Techniques," *Solid–State Electronics* 26(3):179–197 (1983).

Sporken, R., et al., "XPS study of Au/GaN and Pt/GaN contacts," *MRS Internet J. Nitride Semiconductor Res.* 2(23) (1997).

Venugopalan, H.S., et al., "Phase Formation and Morphology in Nickel and Nickel/Gold Contacts To Gallium Nitride," MRS Internet Journal Nitride Semiconductor Research (1997) <URL:http://nsr.mij.mrs.org/MRS/S97–D/4.10>.

Zhou, L., et al., "Characteristics of Ti/Pt/Au Ohmic Contacts on p–type GaN/$Al_xGa_{1-x}N$ Superlattices," *MRS Internet J. Nitride Semicond. Res. F99W10.3*.

Dovidenko, K., et al., "Aluminum nitride films on different orientations of sapphire and silicon," *J. Appl. Phys.* 79(5): 2439–2445, (1996).

Jain, S.C., et al., "Applied Physics Reviews/III—nitrides: Growth, characterization, and properties," *J. Appl. Phys.* 87(3): 965–1006, (2000).

Lin, Y.S., et al., "Dependence of composition fluctuation on indium content in InGaN/GaN multiple quantum wells," *Appl. Phys. Lett.,* 77(19): 2988–2990, (2000).

Narukawa, Y., et al., "Dimensionality of excitons in laser–diode structures composed of $In_xGa_{1-x}N$ multiple quantum wells," *Phys. Rev. B,* 59(15): 10283–10288, (1999).

Kawakami, Y., et al., "Dynamics of optical gain in $In_xGa_{1-x}N$ multi–quantum well–based laser diodes," *Appl. Phys. Lett.,* 77(14): 2151–2153, (2000).

Strite, S., and Morkoc, H., "GaN, AlN, and InN: A review," *J. Vac. Sci. Technol. B,* 10(4):1237–1266, (1992).

Hassan, K.M., et al., "Optical and structural studies of Ge nanocrystals embedded in AlN matrix fabricated by pulsed laser deposition," *Appl. Phys. Lett.,* 75(9): 1222–1224, (1999).

Teng, C.W., et al., "Quantum confinement of $E_1$ and $E_2$ transitions in Ge quantum dots embedded in an $Al_2O_3$ or an AlN matrix," *App. Phys. Lett.,* 76(1): 43–45, (2000).

Narukawa, Y., et al., "Role of self–formed InGaN quantum dots for exciton localization in the purple laser diode emitting at 420 nm," *Appl. Phys. Lett.,* 70(8): 981–983, (1997).

Nakamura, S., "The Roles of Structural Imperfections in InGaN–Based Blue Light–Emitting Diodes and Laser Diodes," *Science Magazine*, 1–14, [retrieved online Aug. 08, 2000]. Retrieved from the Internet <URL: http://www.science.org/cgi/content/full/281/5379/956>.

Chichibu, S., et al., "Spatially resolved cathodoluminescence spectra of InGaN quantum wells," *App. Phys. Lett.,* 71(16): 2346–2348, (1997).

U.S. patent application No. 10/163,099, by Hong K. Choi, filed Jun. 4, 2002, Docket No.: 0717.2025–000.

U.S. patent application No. 10/083,703, by Jagdish Narayan et al., filed Feb. 25, 2002, Docket No.: 0717.2028–000.

U.S. patent application No. 10/207,649, by Jagdish Narayan et al., filed Jul. 26, 2002, Docket No.: 0717.2028–001.

U.S. patent application No. 10/187,466, by John C.C. Fan et al., filed Jun. 28, 2002. Docket No.: 0717.2029–000.

U.S. patent application No. 10/187,465, by Tchang–Hun Oh et al., filed Jun. 28, 2002, Docket No.: 0717.2030–000.

U.S. patent application No. 10/187,468, by Tchang–Hun Oh et al., filed Jun. 28, 2002, Docket No.: 0717.2031–000.

U.S. patent application No. 60/389,750, by John C.C. Fan et al., filed Jun. 17, 2002, Docket No.: 0717.2032–000.

U.S. patent application No. 60/393,008, by Jagdish Narayan, filed Jun. 28, 2002, Docket No.: 0717.2033–000.

\* cited by examiner

METHOD FOR REDUCING THE RESISTIVITY OF P-TYPE II-VI AND III-V SEMICONDUCTORS

BACKGROUND OF THE INVENTION

Recently, much attention has been focused on GaN-based compound semiconductors (e.g., $Ga_xAl_{1-x}N$, $In_xGa_{1-x}N$, and $Al_xGa_yIn_{1-x-y}N$, where $0 \leq x \leq 1$ and $y \geq 0.1$) for blue, green, and ultraviolet light emitting diode (LED) applications. One important reason is that GaN-based LEDs have been found to exhibit efficient light emission at room temperature.

In general, GaN-based LEDs comprise a multilayer structure in which n-type and p-type GaN are stacked on a substrate (most commonly a sapphire substrate), and $In_xGa_{1-x}N$/GaN multiple quantum wells are sandwiched between the p-type and n-type GaN layers. A number of methods for growing the multilayer structure are known in the art, including metalorganic chemical vapor deposition (MOCVD), molecular beam epitaxy (MBE) and hydride vapor phase epitaxy (HVPE).

It is also known in the art that these conventional growth methods for compound semiconductor structures, except for MBE, have proven problematic with respect to forming a p-type GaN-based layer suitable for LED applications. In general, GaN layers formed by known growth methods, such as MOCVD, and doped with p-type material such as magnesium, behave like a semi-insulating or high-resistive material. This is thought to result from hydrogen passivation caused by hydrogen that is present in the reaction chamber complexing with the p-type dopant and thus preventing the dopant from behaving as an active carrier. Because of this phenomenon, p-type GaN having a sufficiently low resistivity to form the p-n junction required for LED and laser diode (LD) applications cannot be produced by MOCVD or HVPE techniques.

Various attempts have been made to overcome the difficulties in obtaining p-type GaN-based compound semiconductors. In one technique, known as low-energy electron-beam irradiation (LEEBI), a high-resistive semi-insulating GaN layer, which is doped with a p-type impurity, such as Mg, and formed on top of multilayers of GaN-based compound semiconductors is irradiated with an electron beam having an acceleration voltage of 5 kV to 15 kV while maintaining the semiconductor material at temperatures up to 600° C., in order to reduce the resistance of the p-doped region near the sample surface. However, with this method, reduction in the resistance of the p-doped layer can be achieved only up to the point that the electron beam penetrates the sample, i.e. a very thin surface portion of less than about 0.5 μm deep. Furthermore, this method requires heating the substrate to temperatures up to approximately 600° C in addition to high-voltage acceleration of the electron beam.

Thermal annealing in a non-hydrogen atmosphere has also been used to activate the p-type dopants. For example, heat treatment at 700° C. to 800° C. in a nitrogen atmosphere is typically used to activate the Mg dopants. However, the high temperature required for activation may degrade the light-emitting efficiency of the device by damaging the lattice structure of the III-V nitride material.

In order to improve the efficiency of GaN-based semiconductor devices such as LEDs and laser diodes, it is necessary to develop improved processes for preparing p-type GaN materials which overcome or reduce these problems.

SUMMARY OF THE INVENTION

The present invention is a method of reducing the resistivity of a p-doped III-V or p-doped II-VI semiconductor material and a method of manufacturing a p-type III-V or p-type II-VI semiconductor material.

In one embodiment, the invention involves reducing the electrical resistivity of a p-doped III-V semiconductor material or a p-doped II-VI semiconductor material by placing the semiconductor material in an electric field.

In another embodiment of the invention, a p-type III-V semiconductor material or p-type II-VI semiconductor material is manufactured by growing a p-type III-V semiconductor material or p-type II-VI semiconductor material by MOCVD or HVPE using reaction gases including a p-type impurity to form a p-doped III-V semiconductor material or p-doped II-VI semiconductor material. An electric field of sufficient strength is then applied to the p-doped III-V semiconductor material or p-doped II-VI semiconductor material for sufficient time to reduce the resistivity of the semiconductor material.

In a specific embodiment, a p-type a III-V nitride, such as $Al_xGa_yIn_{1-x-y}N$, $Ga_xAl_{1-x}N$ or $In_xGa_{1-x}N$, is grown by MOCVD using a nitrogen source and one or more gas selected from the group consisting of an aluminum source, a gallium source and an indium source. Nitrogen source gases include ammonia and hydrazine. Aluminum source gases include trimethyl aluminum and triethyl aluminum. Gallium source gases include trimethyl gallium and triethyl gallium. Indium source gases include trimethyl indium and triethylindium.

In general, a greater decrease in resistivity of the semiconductor material is achieved the higher the electric field and the longer the period of time that the semiconductor material is in the electric field. Typically, the semiconductor is placed in the electric field for at least about 1 minute. More preferably, the semiconductor is placed in the electric field for a time period in a range of between about 10 minute and about 900 minute. The electric field is preferably at least about 10,000 volts/cm. More preferably, the electric field voltage is in the range of between about 10,000 volts/cm and about 1,000,000 volts/cm. However, even higher electric fields can be achieved when the semiconductor material is placed in a vacuum environment.

In a preferred embodiment, the semiconductor material is heated during application of the electric field. Preferably, the semiconductor material is heated to about 300° C. to about 600° C. When the semiconductor material is a III-V nitride, the temperature is typically kept at or below about 600° C. to avoid decomposition of the material. Optionally, the III-V nitride is placed in a nitrogen atmosphere during heating to further inhibit decomposition of the material.

The method of the invention is particularly useful in preparing III-V nitride-based LEDs and laser diodes, such as $Ga_xAl_{1-x}N$, $In_xGa_{1-x}N$, and $Al_xGa_yIn_{1-x-y}N$, where $0 \leq x \leq 1$ and $y \geq 0.1$. These semiconductor materials typically have a direct band gap between 1.95 eV and 6 eV and may be suitable for construction of green, blue and ultraviolet LEDs, and of green, blue and ultraviolet laser diodes. Of particular interest are blue LEDs, which can be fabricated from III-V nitrides, such as InGaN. Since blue is a primary color, its presence is necessary to produce full color displays or pure white light.

However, p-n junction diodes have been difficult to prepare from III-V nitrides because it is difficult to obtain a good quality p-type semiconductor layer. Generally, III-V nitrides semiconductors are n-type materials even when they are not doped with an n-type dopant. This is because the materials form nitrogen lattice vacancies during crystal growth or during thermal annealing. In addition, III-V nitride semiconductors are typically grown by a vapor phase growth method such as MOCVD or HVPE. In such growth methods, compounds are used which contain hydrogen atoms, or hydrogen is used as a carrier gas. The gaseous compounds which contain hydrogen atoms are thermally decomposed during the growth of the III-V semiconductors and hydrogen is released. The released hydrogen atoms are trapped in the growing semiconductor, and complex with p-dopants to inhibit their acceptor function.

The method of the invention is particularly useful for reducing the resistivity of III-V nitrides because thermal annealing III-V nitrides causes lattice vacancies which decrease the light-emitting efficiency of the material. Utilizing the method of the invention, the resistivity of a semiconductor material can be reduced without heating the material or with heating the material to relatively low temperatures compared to the temperature required for the thermal annealing process, thus reducing the number of lattice vacancies in III-V nitrides and improving the light-emitting efficiency of the material.

DETAILED DESCRIPTION OF THE INVENTION

Figure 1:
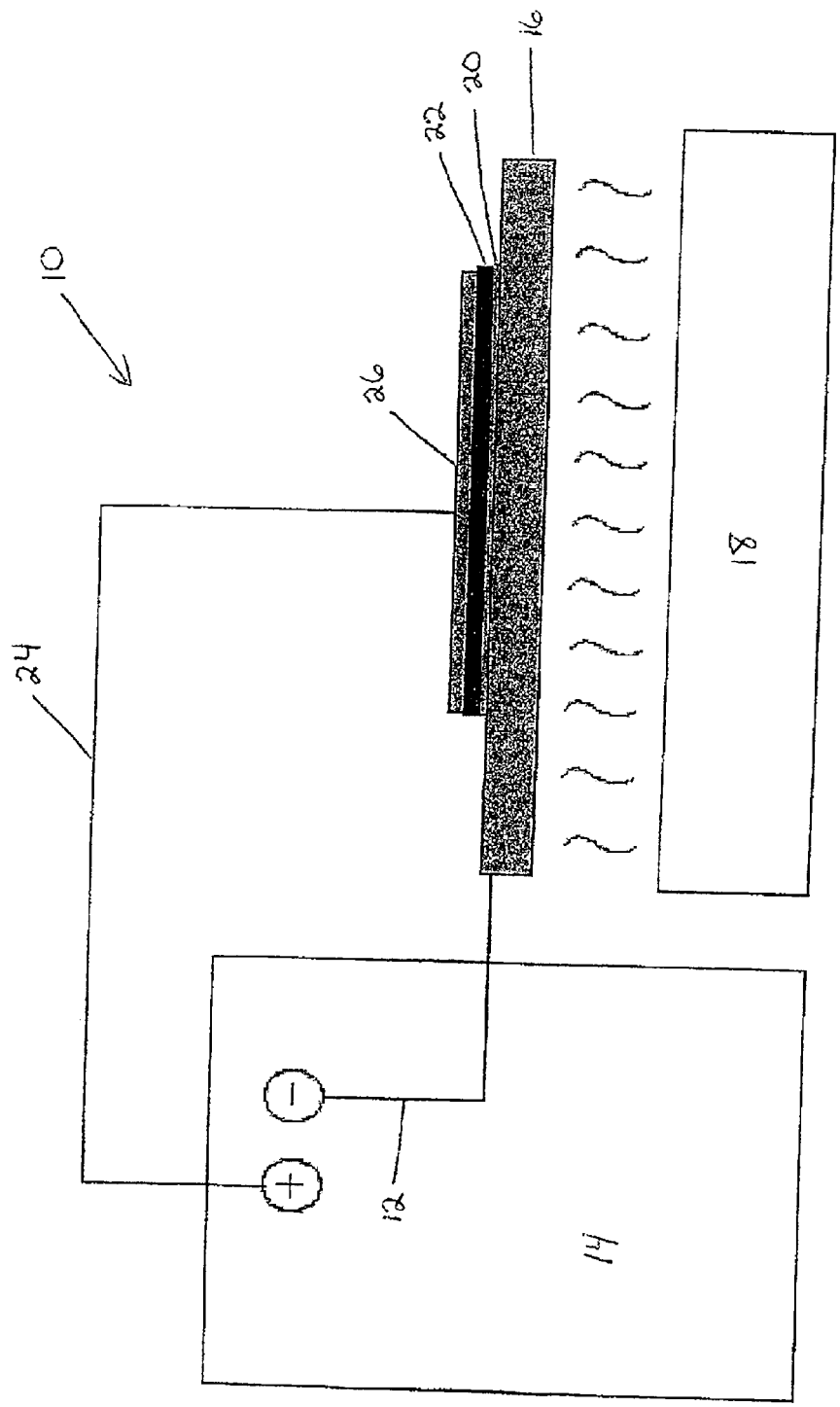
FIG. 1 is a schematic representation of one embodiment of an apparatus for practicing the method of the invention.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

A III-V material is a semiconductor having a lattice comprising at least one element from Group III(A) or III(B) of the Periodic Table and at least one element from Group V(A) or V(B) of the periodic table. Preferably, the III-V semiconductor material comprises at least one element from column III(A) and at least one element from Group V(A) of the Periodic Table. A III-V nitride is a semiconductor having a lattice comprising nitrogen and at least one element from Group III(A) or III(B) of the Periodic Table. Optionally, a III-V nitride can have one or more elements other than nitrogen from Group V(A) or V(B) of the Periodic Table. In one embodiment, the III-V nitride is represented by the formula $Ga_xAl_{1-x}N$, $In_xGa_{1-x}N$, or $Al_xGa_yIn_{1-x-y}N$, where $0 \leq x \leq 1$ and $y \geq 0.1$ A II-VI material is a semiconductor having a lattice comprising at least one element from Group II(A) or II(B) of the Periodic Table and at least one element from Group VI(A) or VI(B) of the Periodic Table.

In the present invention, a dopant means a p- or n-type impurity present in the semiconductor material. The p-type impurities (also called an acceptor) for III-V semiconductor materials include Group II elements such as cadmium, zinc, beryllium, magnesium, calcium, strontium, and barium. Preferred p-type impurities are magnesium and zinc. n-type impurities (also called donors) are used to prepare an n-type layer of a p-n junction diode. n-type impurities for III-V semiconductor materials include Group IV elements such as silicon, germanium and tin, and Group VI elements such as selenium, tellurium and sulfur.

III-V nitride semiconductor materials grown by MOCVD typically use a nitrogen source (e.g., ammonia or dimethylhydrazine) and at least one source gas for depositing a Group III element, such as a gallium source (e.g., trimethylgallium or triethylgallium), an aluminum source (e.g., trimethyl aluminum or diethyl aluminum) and an indium source (e.g., trimethylindium or diethylindium). When the III-V nitride semiconductor material is a p-type material, it is doped with a p-dopant, preferably Mg or Zn. When a p-type III-V nitride semiconductor material is prepared using MOCVD, the reaction gas used to form the semiconductor layer contains a p-type impurity source. For example, Mg-doped III-V nitride semiconductor layer can be prepared using MOCVD in the presence of cyclopentadienylmagnesium as the p-type impurity source, and a Zn-doped III-V nitride semiconductor layer can be prepared using diethylzinc or dimethylzinc as the p-type impurity source.

FIG. 1 is a schematic representation of one embodiment of a suitable apparatus for practicing the method of the invention. As shown therein, apparatus 10 includes negative lead 12 connecting high-voltage variable DC power supply 14 to first metal plate 16 (i.e., negative electrode). First metal plate 16 is placed on top of variable temperature heat stage 18 and is in contact with III-V or II-VI semiconductor material 20 of the workpiece (in FIGS. 1 and 2, III-V or II-VI semiconductor material 20 and substrate 22 are the workpiece to be treated by the method of the invention). In general, the III-V or II-VI semiconductor epitaxial layers are grown on substrate 22 such that at least one surface of substrate 22 is covered with one or more epitaxial layers, at least one of which is a p-type epitaxial layer. One or more n-type semiconductor epitaxial layers and one or more undoped semiconductor epitaxial layers may also be present. Typically, II-VI or III-V semiconductor material 20 is placed on top of first metal plate 16 such that the p-type epitaxial layer is in contact with first metal plate 16. Optionally, it is possible to have other layers, such as a metal, semiconductor or insulator, in between the first metal plate and the p-type layer. Variable-temperature heat stage 18 can be used to heat the semiconductor material during application of the electric field. Positive lead 24 of power supply 14 is connected to second metal plate 26 (i.e., positive electrode), which is placed in contact with substrate 22. If substrate 22 is an electrically conducting substrate, insulating material 28 may optionally inserted between substrate 22 and second metal plate 26 to prevent the current flow, as shown in FIG. 2.

Figure 2:
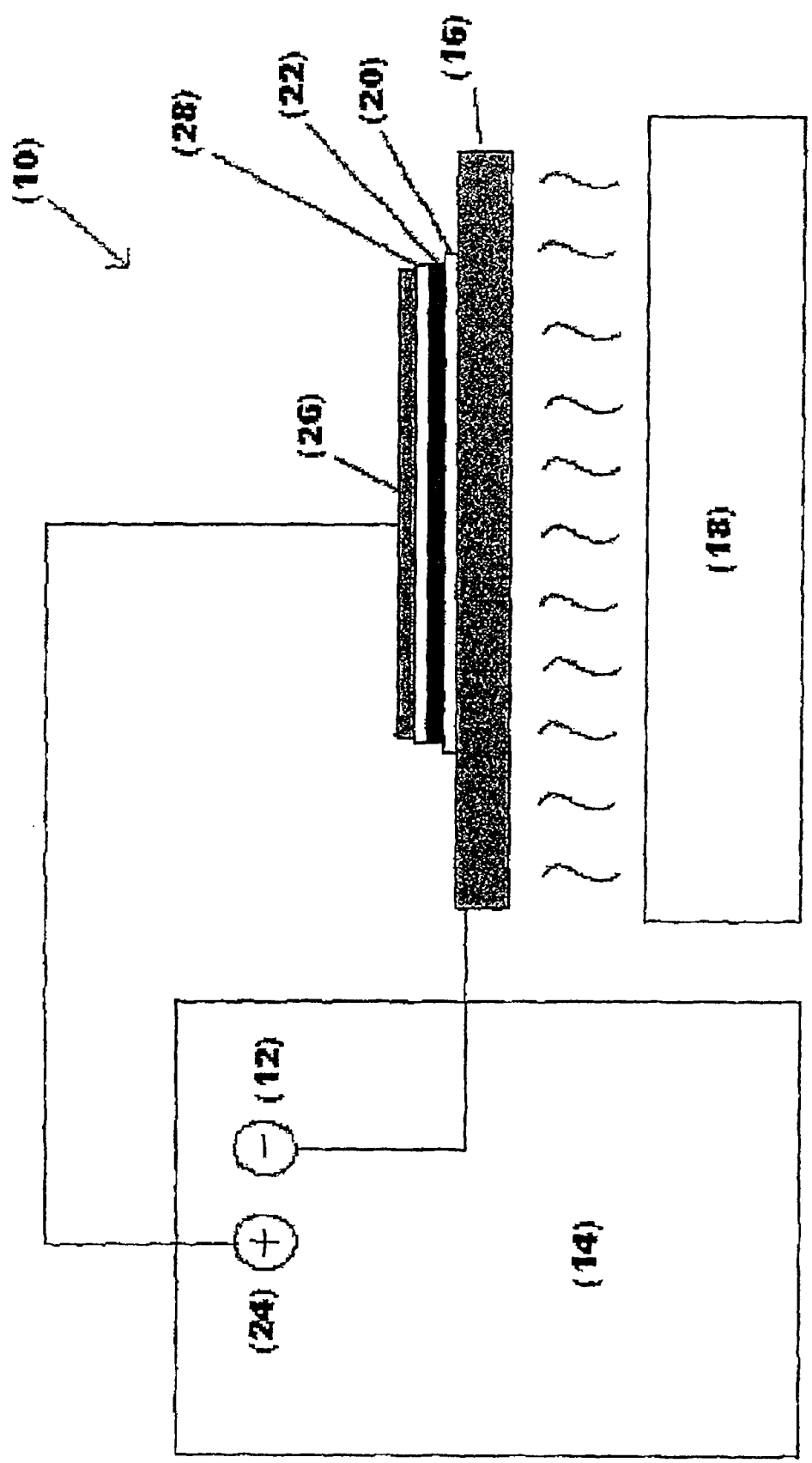
FIG. 2 is a schematic representation of another embodiment of an apparatus for practicing the method of the invention.

Using the apparatus depicted in FIGS. 1 and 2, an electric field is applied to a p-doped II-VI or III-V semiconductor material (20) to reduce the resistivity of the material. As discussed above, a greater decrease in resistivity of the semiconductor material is achieved as the strength of the electric field is increased and as the period of time that the semiconductor material is exposed to the electric field is increased. Typically, the resistivity of the p-type semiconductor material (20) is reduced by at least about one order of magnitude. In one embodiment, the resistivity of the p-type semiconductor material is reduced by at least about two orders of magnitude. The p-doped II-VI or III-V semiconductor material and the first and second metal plates of the apparatus of FIGS. 1 and 2 can be placed in an environment of less than atmospheric pressure in order to achieve a higher electric field. Typically, the electric field is at least about 10,000 volts/cm.

In general, the resistivity of a semiconductor is reduced by placing it in an electric field for at least about 1 minute. More preferably, the semiconductor is placed in the electric field for a time period in a range of between about 10 minute and about 900 minute.

Optionally, the semiconductor material is heated during application of the electric field, typically to at least about 300° C. When the semiconductor material is a III-V nitride, the temperature preferably is kept at or below about 600° C. to avoid decomposition of the material. Optionally, the III-V nitride is placed in a nitrogen atmosphere during heating to further inhibit decomposition of the material.

III-V semiconductor materials and II-VI semiconductor materials are typically grown by a vapor phase growth method such as MOCVD or HVPE. In such growth methods, compounds are used which contain hydrogen atoms, or hydrogen is used as a carrier gas. The gaseous compounds which contain hydrogen atoms are thermally decomposed during the growth of the III-V or II-VI semiconductor material and hydrogen is released. The released hydrogen atoms are trapped in the growing semiconductor, and complex with p-dopants to inhibit their acceptor function.

Application of an electric field after growth of the semiconductor layers is believed to disrupt the hydrogen-p-dopant complexes and expel the released hydrogen from the semiconductor material, thereby restoring the acceptor function of the p-dopants. The function of p-dopants in III-V and II-VI semiconductor materials can be restored by an electric field because hydrogen trapped in the material is typically present as a positively charged ion. The positively charged hydrogen complexed with p-dopants is drawn to the negatively charged electrode and is expelled from the semiconductor material. Thus, more of the p-dopants in the semiconductor material are free to act as acceptors, resulting in a decrease in the resistivity of the material. In addition, the III-V semiconductor material or II-VI semiconductor material can be heated during application of the electric field to within a few degrees (about 10° C.) of the decomposition temperature of the semiconductor material to further reduce the resistivity of the material.

The following are examples of embodiments of the invention, and are not intended to be limiting in any way.

EXAMPLES

I. Thermal Annealing Control

Figure 3:
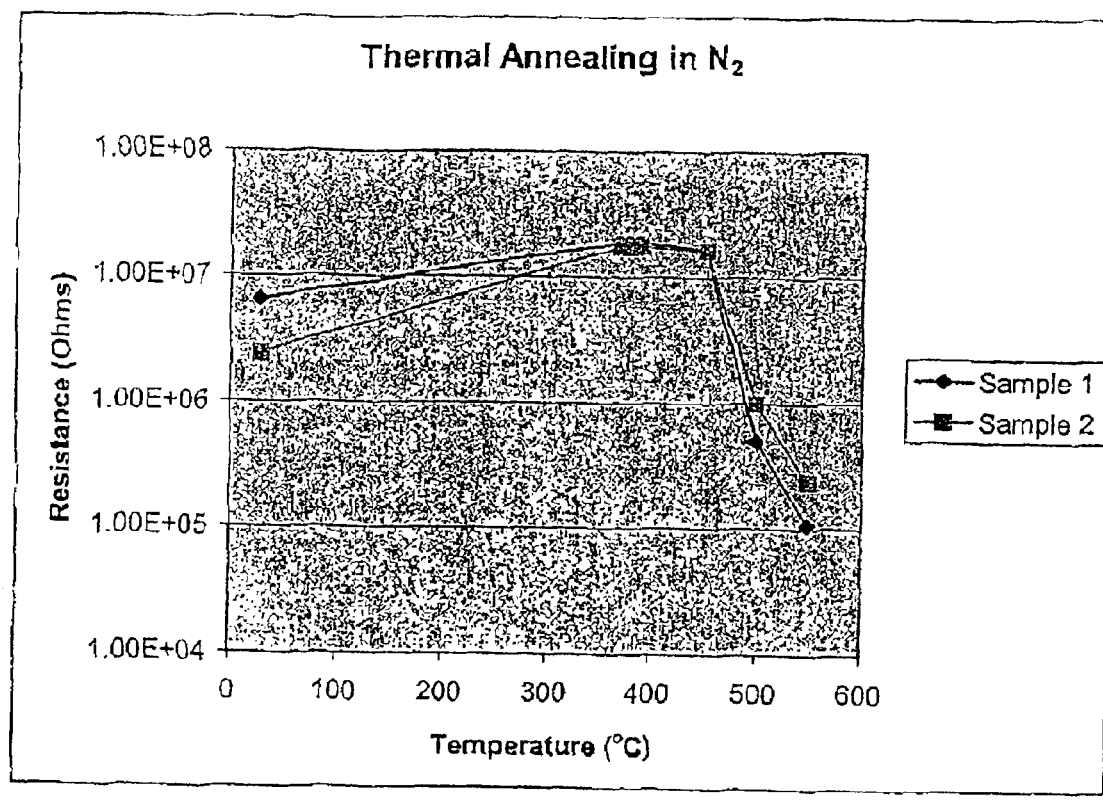
FIG. 3 shows a graph of the sheet resistivity of a magnesium-doped p-type layer of an InGaN/GaN LED versus temperature of two samples that have been thermal-annealed in a nitrogen atmosphere for 30 minute.

Two InGaN/GaN LED structures having a Mg-doped p-type GaN layer were heated for 30 minutes at 27° C., 370° C., 380° C., 390° C., 440° C., 500° C. and 550° C. under a nitrogen atmosphere. The LED structure consisted of a Si-doped (Si concentration=~4×10$^{18}$ cm$^{-3}$) n-type GaN layer, a multiple-quantum-well InGaN/GaN active region, and a Mg-doped (Mg concentration=~5×10$^{19}$ cm$^{-3}$) p-type GaN layer. The LED structure was grown on a 430-$\mu$m-thick sapphire substrate. The sheet resistance of the Mg-doped layer was measured after 30 minute at each temperature by placing indium performs on the exposed surface of the Mg-doped layer. Point resistance was measured by an ohm meter. A graph shown in FIG. 3 indicates that no decrease in the resistance of the Mg-doped GaN layer was observed between the annealing temperatures of 27° C. to 450° C.; the resistivity of the Mg-doped GaN layer did not begin to drop significantly until the annealing temperature reached about 500° C.

II. Electric-Field-Assisted Activation of Acceptors at 380° C.

Figure 4:
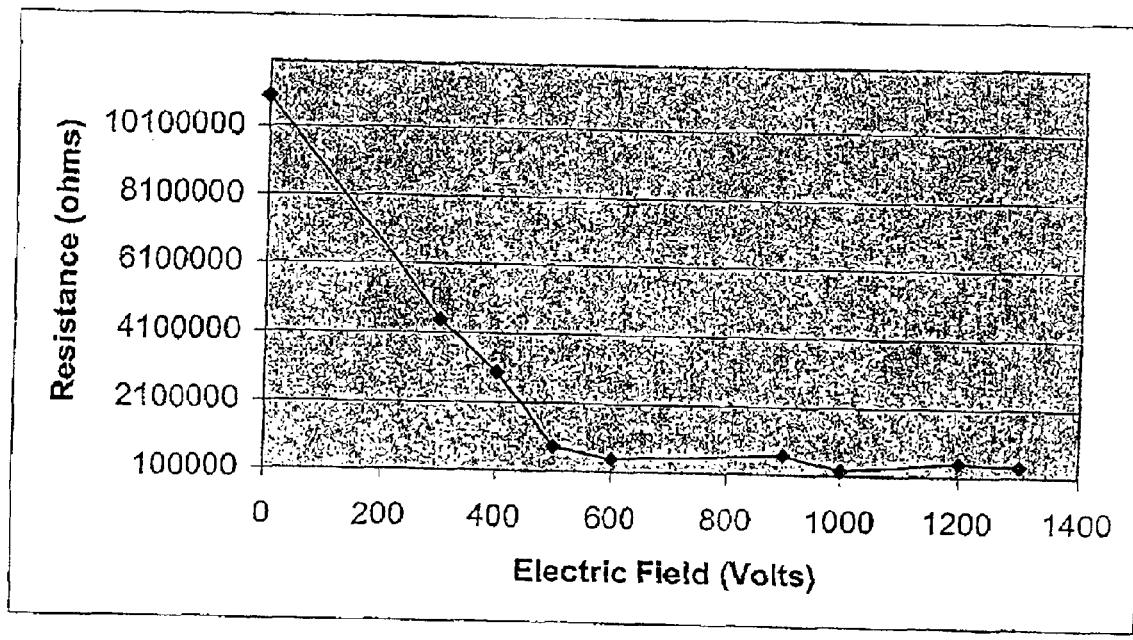
FIG. 4 is a plot of sheet resistivity of a magnesium-doped p-type layer of an InGaN/GaN LED versus voltage applied to the InGaN/GaN LED during electric-field-assisted activation, wherein the InGaN/GaN LED was held at a fixed temperature of 380° C. during application of the electric field for 30 minute, according to one embodiment of the invention.

An InGaN/GaN LED structure having a Mg-doped p-type GaN layer similar to the structure used in Example 1 was heated to a fixed temperature of 380° C. in an ambient atmosphere. An electric field was applied to the LED for 30 minute at 300 volts, 400 volts, 500 volts, 600 volts, 900 volts, 1000 volts, 1200 volts and 1300 volts using the apparatus depicted in FIG. 1. The sheet resistance of the Mg-doped layer was measured after 30 minute at each voltage setting by placing indium performs on the exposed surface of the Mg-doped layer. Point resistance was measured by an ohm meter. A graph shown in FIG. 4 indicates that resistance dropped sharply upon application of the electric field.

III. Electric-Field Assisted Activation of Acceptors at 400° C.

Figure 5:
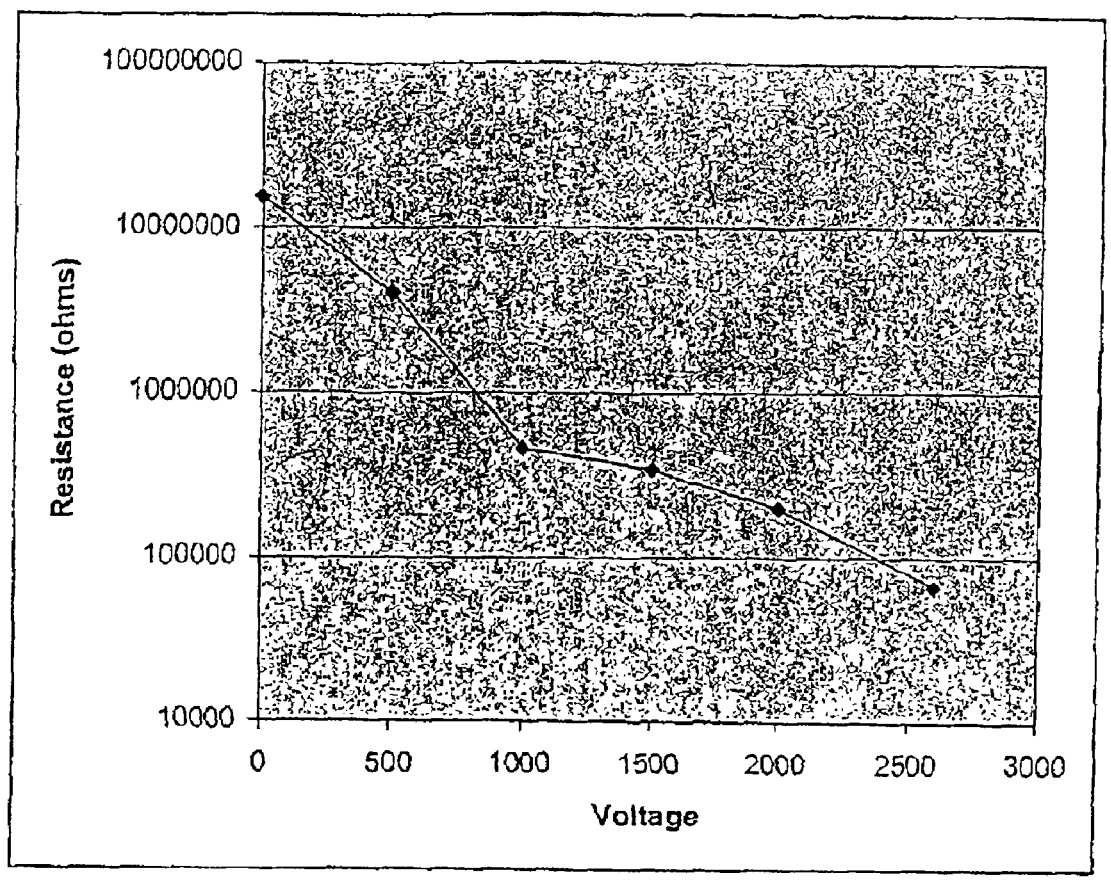
FIG. 5 is a plot of sheet resistivity of a magnesium-doped p-type layer of an InGaN/GaN LED versus voltage applied to the InGaN/GaN LED during electric-field-assisted activation, wherein the InGaN/GaN LED was held at a fixed temperature of 400° C. during application of the electric field for 30 minute, according to another embodiment of the invention.

An InGaN/GaN LED structure having a Mg-doped p-type GaN layer similar to the structure used in Example 1 was heated to a fixed temperature of 400° C. in an ambient atmosphere. An electric field was applied to the LED for 30 minute at 500 volts, 1000 volts, 1500 volts, 2000 volts, and 2600 volts using the apparatus depicted in FIG. 1. The sheet resistance of the Mg-doped layer was measured after 30 minute at each voltage setting by placing indium performs on the exposed surface of the Mg-doped layer. Point resistance was measured by an ohm meter. A graph shown in FIG. 5 indicates that resistance dropped sharply upon application of the electric field and continued to drop steadily as the voltage was increased.

IV. Electric-Field Assisted Activation of Acceptors at 400° C.

Figure 6:
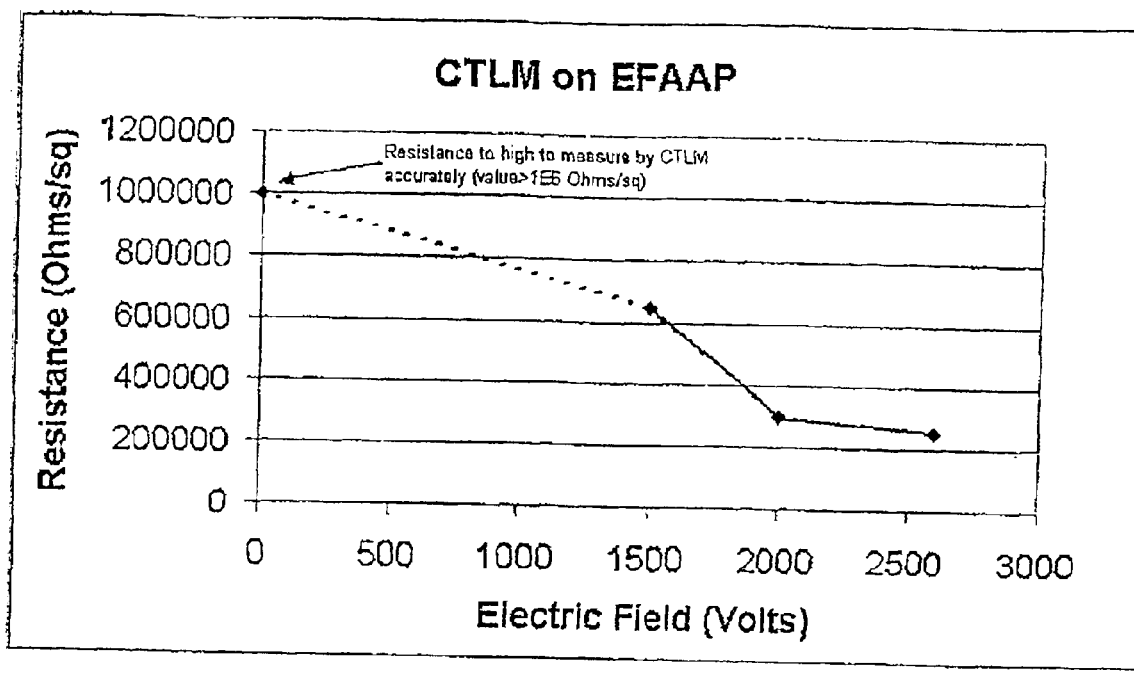
FIG. 6 is a plot of sheet resistivity of a magnesium-doped p-type layer of an InGaN/GaN LED versus voltage applied to the InGaN/GaN LED during electric-field-assisted activation, according to one embodiment of the method of the invention.

An InGaN/GaN LED structure having a Mg-doped p-type GaN layer similar to the structure used in Example 1 was heated to a fixed temperature of 400° C. in an ambient atmosphere. An electric field was applied to the LED for 30 minute at 1500 volts, 2000 volts, and 2600 volts using the apparatus depicted in FIG. 1. After 30 minute at each voltage setting, sheet resistance measurements of the Mg-doped layer were carried out by standard circular transmission line measurements (CTLM) on the exposed top surface of the Mg-doped layer of the GaN LED. All metalization alloying temperatures were kept below 400° C. A graph shown in FIG. 6 indicates that resistance dropped steadily as the voltage was increased from 1500 volts to 2600 volts. The sheet resistance of the Mg-doped layer before the electric field was applied was too high to be measure by CTLM, but is conservatively estimated to be about $1\times10^6$ Ω/sq.

V. Electric-Field Assisted Activation of Acceptors at 400° C.

An InGaN/GaN LED structure having a Mg-doped p-type GaN layer similar to the structure used in Example 1 was heated to a fixed temperature of 400° C. in an ambient atmosphere. An electric field was applied to the LED for 900 minute at a fixed voltage of 2100 volts using the apparatus depicted in FIG. 1. After application of the electric field for 900 minute the sheet resistance was measured by CTLM to be 82,810 Ω/sq.

Figure 7:
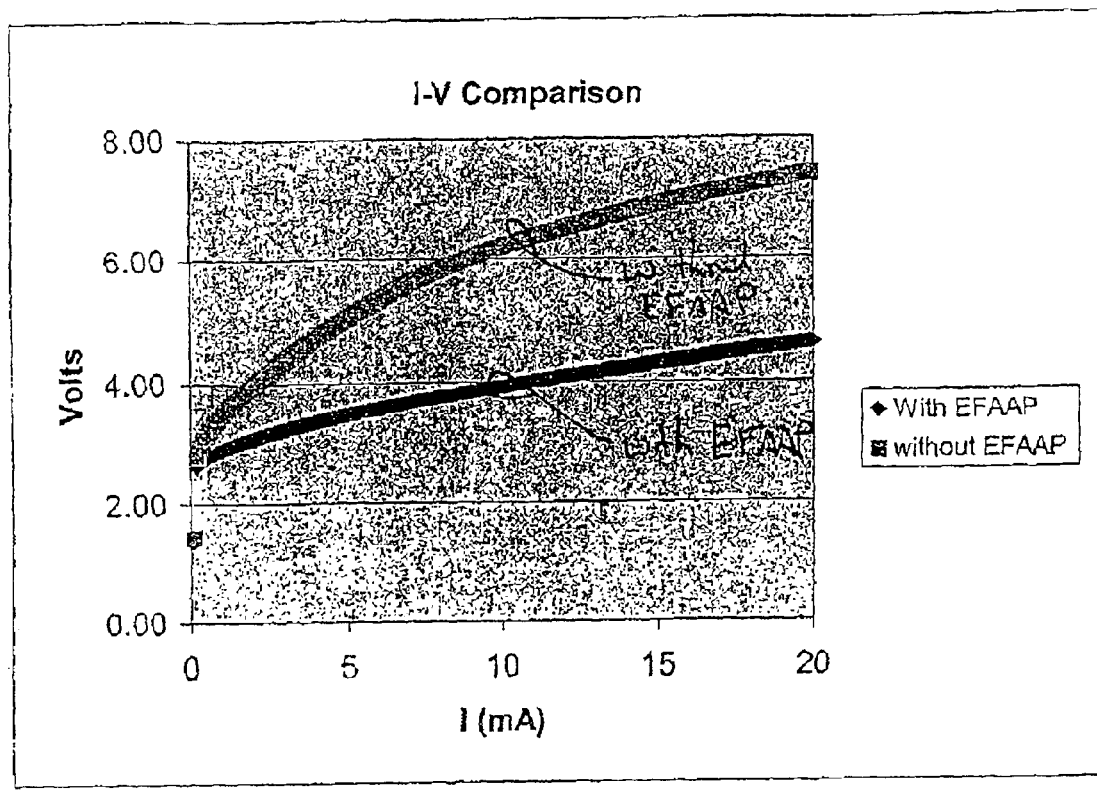
FIG. 7 is a graph of current verses the applied voltage in the forward bias mode of an InGaN/GaN LED having a Mg-doped p-type GaN layer that has been treated with the method of the invention with a piece of the same sample that was untreated.

VI. Current/Voltage Characteristics of a GaN LED Treated with the Method of the Invention An InGaN/GaN LED structure having a Mg-doped p-type GaN layer similar to the structure used in Example 1 was divided into two pieces. The first piece of the GaN LED was heated to a fixed temperature of 400° C. in an ambient atmosphere, and an electric field was applied to the LED for 2.5 hours at a fixed voltage of 2100 volts using the apparatus depicted in FIG. 1. The second piece of the GaN LED was untreated and used as a control. The current/voltage measurements were carried out on the electric-field-treated InGaN/GaN LED and the control by placing one indium perform on the top surface of the Mg-doped p-type GaN layer and another indium perform on the n-type GaN layer. The results shown in FIG. 7 indicate that in the forward bias mode a higher voltage is necessary to obtain a given current in the LED in the control than in the LED treated with an electric field. This provides evidence that the LED treated with an electric field has a higher concentration of active carriers than the control LED.

Figure 8:
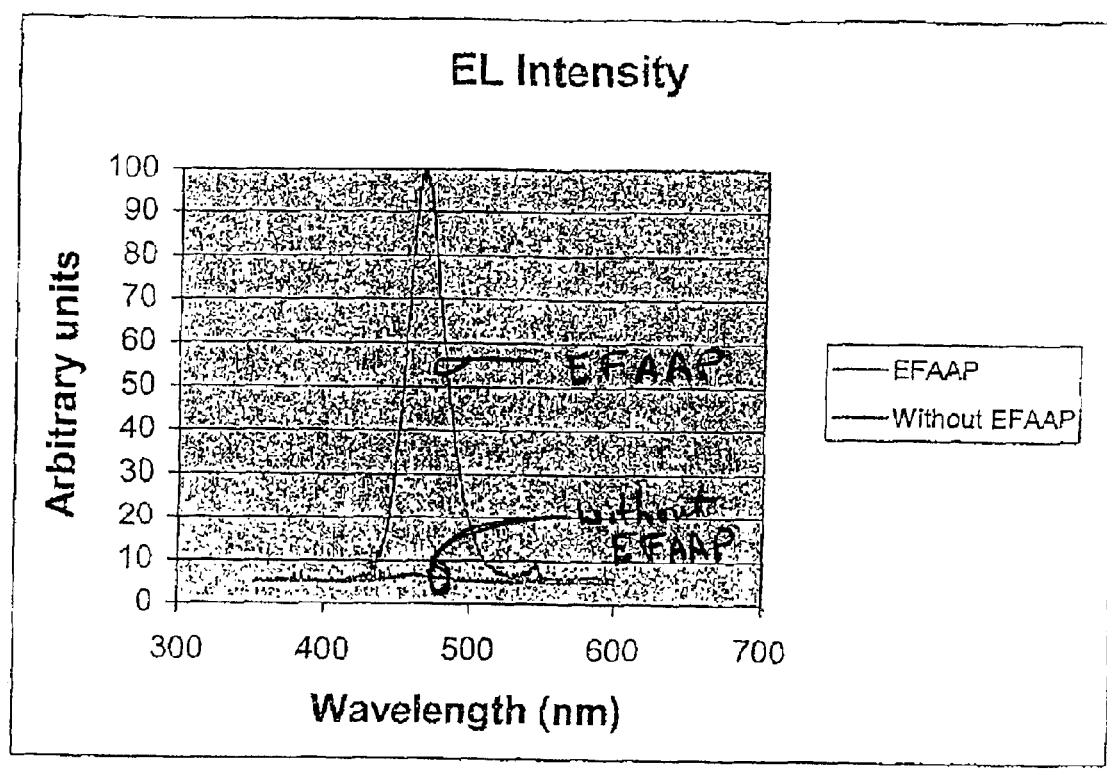
FIG. 8 is a graph comparing the electoluminescence intensity of an InGaN/GaN LED having a Mg-doped p-type GaN layer that has been treated with the method of the invention with the electoluminescence intensity of a piece of the same sample that was untreated.

VII. Electroluminescence of an InGaN/GaN LED Treated with the Method of the Invention The electroluminescence of the control InGaN/GaN LED and the electric field treated InGaN/GaN LED prepared in Example VI were measured by placing one indium perform on the top surface of the Mg-doped p-type GaN layer and another indium perform on the n-type GaN layer. An electric current of 20 mA was applied and the electroluminescence was measured. The results shown in FIG. 8 indicate that treatment with the method of the invention dramatically increased the light output of the LED as compared to the untreated control.

Equivalents

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of reducing the resistivity of a p-doped III-V semiconductor material or a p-doped II-VI semiconductor material, comprising the step of placing the semiconductor material in an electric field, whereby the electrical resistivity of the material is reduced.

2. The method of claim 1, wherein the electric field is at least about 10,000 volts/cm.

3. The method of claim 2, further comprising the step of heating the semiconductor material to a temperature of about 300° C. to about 600° C. during application of the electric field.

4. The method of claim 3, wherein the semiconductor material is under less than atmospheric pressure.

5. The method of claim 3, wherein the semiconductor material is a III-V nitride compound.

6. The method of claim 5, wherein the semiconductor material is in a nitrogen atmosphere.

7. The method of claim 5, wherein the p-dopant is selected from the group consisting of Zn, Cd, Be, Mg, Ca, and Ba.

8. The method of claim 7, wherein the III-V nitride compound is $Al_xGa_yIn_{1-x-y}N$, $G_xAl_{1-x}N$ or $In_xGa_{1-x}N$, wherein $x \geq 0$ and $y \geq 0.1$.

9. A method of manufacturing a p-type III-V or p-type II-VI semiconductor material, comprising the steps of:
   a) growing the semiconductor material using a reaction gas comprising a p-type impurity source, wherein the semiconductor material is a III-V or II-VI semiconductor material; and
   b) applying an electric field to the semiconductor material, thereby reducing the resistivity of the semiconductor material and forming a p-type III-V or p-type II-VI semiconductor material.

10. The method of claim 9, wherein the semiconductor material using a growth method selected from metalorganic chemical vapor deposition (MOCVD) and hydride vapor phase epitaxy (HVPE).

11. The method of claim 9, wherein the electric field is in a range of between about 10,000 volts/cm and about 1,000,000 volts/cm.

12. The method of claim 11, further comprising the step of heating the substrate to a temperature of about 300° C. to about 600° C.

13. The method of claim 12, wherein the semiconductor material is in a vacuum environment during application of the electric field.

14. The method of claim 12, wherein the semiconductor material is a III-V nitride compound.

15. The method of claim 14, wherein the semiconductor material is in a nitrogen atmosphere during application of the electric field.

16. The method of claim 14, wherein the p-type impurity is selected from the group consisting of Zn, Cd, Be, Mg, Ca, and Ba.

17. The method of claim 14, wherein the III-V nitride compound is $Al_xGa_yIn_{1-x-y}N$, $Ga_xAl_{1-x}N$ or $In_xGa_{1-x}N$, wherein $x \geq 0$ and $y \geq 0.1$.

18. The method of claim 14, wherein the III-V nitride is grown using metalorganic chemical vapor deposition (MOCVD) and the reaction gas further comprises a nitrogen source and one or more gas selected from the group consisting of an aluminum source, a gallium source, and an indium source.

19. The method of claim 18 wherein:
   a) the aluminum source is selected from the group consisting of trimethyl aluminum and triethyl aluminum;
   b) the gallium source is selected from the group consisting of trimethyl gallium and triethyl gallium;
   c) the indium source is selected from the group consisting of trimethyl indium and triethylindium; and
   d) the nitrogen source is selected from the group consisting of ammonia and hydrazine.

* * * * *

UNITED STATES PATENT AND TRADEMARK OFFICE
CERTIFICATE OF CORRECTION

PATENT NO. : 6,911,079 B2
DATED : June 28, 2005
INVENTOR(S) : Peter Rice et al.

It is certified that error appears in the above-identified patent and that said Letters Patent is hereby corrected as shown below:

Column 8,
Line 14, delete "$G_xAl_{1-x}N$" and insert -- $Ga_xAl_{1-x}N$ --.

Signed and Sealed this

Twenty-seventh Day of September, 2005

JON W. DUDAS
*Director of the United States Patent and Trademark Office*